US008043200B2

(12) United States Patent
Tajiri et al.

(10) Patent No.: US 8,043,200 B2
(45) Date of Patent: Oct. 25, 2011

(54) METHOD AND STORAGE MEDIUM FOR REPLACING PROCESS INSTRUMENT IN PROCESSING APPARATUS

(75) Inventors: Naoyuki Tajiri, Koshi (JP); Akifumi Suzuki, Koshi (JP); Daisuke Honma, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/879,480

(22) Filed: Sep. 10, 2010

(65) Prior Publication Data

US 2011/0005052 A1    Jan. 13, 2011

Related U.S. Application Data

(62) Division of application No. 11/656,423, filed on Jan. 23, 2007, now Pat. No. 7,815,558.

(30) Foreign Application Priority Data

Feb. 6, 2006  (JP) ................................. 2006-028379

(51) Int. Cl.
*B23Q 3/155* (2006.01)
*H01L 21/677* (2006.01)

(52) U.S. Cl. .......... 483/1; 483/2; 483/3; 483/4; 483/12; 118/697; 118/707; 118/66; 156/345.31; 156/345.32; 414/935; 427/240

(58) Field of Classification Search .................. 118/663, 118/668, 676, 696–698, 707, 66; 156/345.31, 156/345.32; 414/935, 936, 937, 939, 940; 483/1, 3, 2, 7, 4, 12; 427/240

See application file for complete search history.

(56) References Cited

U.S. PATENT DOCUMENTS

| 6,150,627 | A | 11/2000 | Sugiyama |
| 6,456,364 | B1 | 9/2002 | Imai |
| 6,821,073 | B1 | 11/2004 | Koguchi |
| 7,292,909 | B2 | 11/2007 | Inada et al. |
| 7,815,558 | B2 * | 10/2010 | Tajiri et al. .................. 483/4 |
| 2001/0041651 | A1 | 11/2001 | Abe et al. |
| 2005/0130453 | A1 | 6/2005 | Inada et al. |
| 2005/0279281 | A1 | 12/2005 | Yamashita et al. |
| 2008/0032502 | A1 | 2/2008 | Baskin et al. |

FOREIGN PATENT DOCUMENTS

JP    2006-012912    1/2006

* cited by examiner

*Primary Examiner* — Erica E Cadugan
(74) *Attorney, Agent, or Firm* — Smith, Gambrell & Russell, LLP

(57) ABSTRACT

Disclosed is a method for replacing a process instrument in a processing apparatus, in which a target object is loaded by transfer mechanism into a processing unit and is subjected to a process by use of the process instrument. The method includes confirming that a process on the target object is finished in a processing unit designated as a process instrument replacement target, and providing information that a process instrument replacing operation is permitted to start. The method further includes, when a shutter of the processing unit designated as the process instrument replacement target is closed to perform a process instrument replacing operation and an operation prohibition state is thereby applied to the transfer mechanism, canceling the operation prohibition state to allow the transfer mechanism to perform a load/unload operation relative to a processing unit not designated as a process instrument replacement target.

19 Claims, 8 Drawing Sheets

METHOD AND STORAGE MEDIUM FOR REPLACING PROCESS INSTRUMENT IN PROCESSING APPARATUS

CROSS REFERENCE TO RELATED APPLICATION

This application is a division of Ser. No. 11/656,423, filed Jan. 23, 2007, which is being incorporated in its entirety herein by reference.

BACKGROUND OF THE INVENTION

1. Field of the Invention

The present invention relates to a method for replacing a process instrument in a processing apparatus used for processing a target object, such as a semiconductor wafer, and a storage medium that stores a program for replacement.

2. Description of the Related Art

In general, in the steps for manufacturing semiconductor devices or the like, a photolithography technique is utilized to form a resist pattern on the surface of a substrate to be processed (which will be referred to as a target object), such as a semiconductor wafer or LCD substrate. This photolithography technique includes a resist coating process for applying a resist liquid onto the surface of the target object; a light exposure process for subjecting the resist film thus formed to light exposure with a circuit pattern; and a developing process for supplying a developing solution onto the target object treated by the light exposure process. These processes are performed by use of a coating/developing apparatus.

In general, a coating/developing apparatus includes a carry-in section and a carry-out section for transferring target objects into and out of the apparatus; processing units for performing processes of various types, such as the resist coating process, light exposure process, and developing process, described above; and an interface section for transferring target objects between these areas. The interface section includes transfer means, such as a transfer arm, by which target objects are sequentially transferred from the carry-in section to selected ones of the processing units. Each of the processing units has a transfer port provided with a shutter, through which a target object is loaded into the processing unit. The target object thus loaded is subjected to a process, such as the coating process, in the processing unit. Thereafter, the processed target object is transferred by the transfer means to another processing unit or the carry-out section.

Each of the processing units has an opening provided with a cover door on the side (outer side) opposite to the transfer port provided with the shutter. Where a maintenance operation is performed on each of the processing units, the cover door of the opening is opened by an operator. When the cover door is opened, an interlock mechanism is activated to stop the entire operation of the coating/developing apparatus, thereby satisfying a safety standard.

For example, a coating unit includes a spin chuck located therein for holding a target object or substrate, and a process cup serving as a process instrument for surrounding the spin chuck and target object. A process liquid is supplied onto the surface of the substrate set in a state described above, while the substrate is being rotated. Currently, the process cup needs to be replaced twice a week. When the cover door of the coating unit is opened to perform this cup replacing operation in the middle of processes, the interlock mechanism is activated to stop the transfer means or transfer mechanism. In light of this, conventionally, the process cup replacing operation is performed after the light exposure process and developing process in processing units are finished and all the target objects are collected into a carrier.

However, while the interlock mechanism is in an activated state for maintenance of one of the processing units, the coating/developing apparatus is entirely stopped until the maintenance is finished. This means that the operation rate of the apparatus is decreased.

In light of this, there is proposed a substrate processing apparatus to improve the apparatus operation rate (for example, see Jpn. Pat. Appln. KOKAI Publication No. 2006-12912). According to this apparatus, an interlock mechanism is set disabled on the condition that the shutter of the transfer port of a processing unit is closed by an operator. This makes it possible to prevent the processing apparatus from being undesirably entirely stopped when the cover door is opened.

However, depending on the type of a processing unit, unsolved problems remain when an operator simply closes the shutter by a switching operation to set the interlock mechanism disabled.

For example, where a processing apparatus includes only one coating unit as a whole, a replacing operation of the process cup of this coating unit brings about a state where no usable coating unit is present in the apparatus. In this case, it is necessary to set takeoff suspension of the next lot and/or to stop the processing apparatus entirely. Further, even where a processing apparatus includes a plurality of coating units, the program needs to be modified to bypass the processing unit designated as a cup replacement target.

Further, where a cup replacing operation is performed on a coating unit, it is preferable that the process cup can be replaced immediately after the process in the coating unit is finished. However, the conventional technique is arranged such that an operator closes the shutter of the transfer port of an objective processing unit by a switching operation, without an automatic judgment as to whether the process in the processing unit is finished. In this case, the operator is required to make a judgment as to when the shutter should be closed while processes are sequentially performed. Accordingly, a time delay tends to be caused after the process in the processing unit is finished and before the shutter is closed and the cover door is opened.

Such a problem may be also caused in replacement or inspection of another process instrument that constitutes a processing unit, such as a nozzle or spin chuck, besides a process cup.

BRIEF SUMMARY OF THE INVENTION

An object of the present invention to provide a method for replacing a process instrument and a storage medium that stores a program for replacement. This method allows a process instrument, such as a process cup, to be replaced, while a process is continued in a processing unit including a process instrument not designated as a replacement target. Further, this method allows the next lot to be continuously processed by a processing unit of the same type including no process instrument to be replaced.

According to a first aspect of the present invention, there is provided a method for replacing a process instrument in a processing apparatus, in which an target object is loaded by transfer means into a processing unit and is subjected to a process by use of the process instrument, the method comprising: confirming that a process on the target object is finished in a processing unit designated as a process instrument replacement target, and providing information that a process instrument replacing operation is permitted to start; and, when a shutter of the processing unit designated as the process instrument replacement target is closed to perform a process instrument replacing operation and an operation prohibition state is thereby applied to the transfer means, canceling the operation prohibition state to allow the transfer means to perform a load/unload operation relative to a processing unit not designated as a process instrument replacement target.

According to a second aspect of the present invention, there is provided a method for replacing a process instrument in a processing apparatus, in which a target object from a carry-in section is sequentially loaded by transfer means into some of a plurality of processing units to perform a process thereon, and the target object thus processed is unloaded by the transfer means to a carry-out section, wherein the processing units comprise a processing unit that includes a process instrument and is configured to perform a process on the target object by use of the process instrument, the method comprising: setting an appointment for a process instrument replacement target; setting takeoff suspension of a next lot from the carry-in section, in response to the appointment being set, before staring a process instrument replacing operation; confirming that a process on the target object is finished in a processing unit designated as the process instrument replacement target, and providing information that a process instrument replacing operation is permitted to start; when a shutter of the processing unit designated as the process instrument replacement target is closed to perform a process instrument replacing operation and an operation prohibition state is thereby applied to the transfer means, canceling the operation prohibition state to allow the transfer means to perform a load/unload operation relative to a processing unit not designated as a process instrument replacement target; and canceling the takeoff suspension of the next lot from the carry-in section, in response to a process instrument replacing operation being finished.

According to a third aspect of the present invention, there is provided a method for replacing a process instrument in a processing apparatus, in which a target object from a carry-in section is sequentially loaded by transfer means into some of a plurality of processing units to perform a process thereon, and the target object thus processed is unloaded by the transfer means to a carry-out section, wherein the processing units comprise processing units of the same type that includes a process instrument and is configured to perform a process on the target object by use of the process instrument, the method comprising: setting an appointment for a process instrument replacement target; confirming that a process instrument in one of the processing units of the same type is to be replaced, and changing a transfer schedule for transferring the target object, preset prior to the appointment, into a transfer schedule arranged to avoid use of a processing unit designated as the process instrument replacement target; confirming that a process on the target object is finished in the processing unit designated as the process instrument replacement target, and providing information that a process instrument replacing operation is permitted to start; and, when a shutter of the processing unit designated as the process instrument replacement target is closed to perform a process instrument replacing operation and an operation prohibition state is thereby applied to the transfer means, canceling the operation prohibition state to allow the transfer means to perform a load/unload operation relative to a processing unit not designated as a process instrument replacement target.

According to a fourth aspect of the present invention, there is provided a storage medium that stores a program for execution on a computer to replace a process instrument in a processing apparatus, in which an target object is loaded by transfer means into a processing unit and is subjected to a process by use of the process instrument, wherein the program causes the computer to execute: confirming that a process on the target object is finished in a processing unit designated as a process instrument replacement target, and providing information that a process instrument replacing operation is permitted to start; and, when a shutter of the processing unit designated as the process instrument replacement target is closed to perform a process instrument replacing operation and an operation prohibition state is thereby applied to the transfer means, canceling the operation prohibition state to allow the transfer means to perform a load/unload operation relative to a processing unit not designated as a process instrument replacement target.

According to a fifth aspect of the present invention, there is provided a storage medium that stores a program for execution on a computer to replace a process instrument in a processing apparatus, in which a target object from a carry-in section is sequentially loaded by transfer means into some of a plurality of processing units to perform a process thereon, and the target object thus processed is unloaded by the transfer means to a carry-out section, wherein the processing units comprise a processing unit that includes a process instrument and is configured to perform a process on the target object by use of the process instrument, and wherein the program causes the computer to execute: setting an appointment for a process instrument replacement target; setting takeoff suspension of a next lot from the carry-in section, in response to the appointment being set, before staring a process instrument replacing operation; confirming that a process on the target object is finished in a processing unit designated as the process instrument replacement target, and providing information that a process instrument replacing operation is permitted to start; when a shutter of the processing unit designated as the process instrument replacement target is closed to perform a process instrument replacing operation and an operation prohibition state is thereby applied to the transfer means, canceling the operation prohibition state to allow the transfer means to perform a load/unload operation relative to a processing unit not designated as a process instrument replacement target; and canceling the takeoff suspension of the next lot from the carry-in section, in response to a process instrument replacing operation being finished.

According to a sixth aspect of the present invention, there is provided a storage medium that stores a program for execution on a computer to replace a process instrument in a processing apparatus, in which a target object from a carry-in section is sequentially loaded by transfer means into some of a plurality of processing units to perform a process thereon, and the target object thus processed is unloaded by the transfer means to a carry-out section, wherein the processing units comprise processing units of the same type that includes a process instrument and is configured to perform a process on the target object by use of the process instrument, and wherein the program causes the computer to execute: setting an appointment for a process instrument replacement target; confirming that a process instrument in one of the processing units of the same type is to be replaced, and changing a transfer schedule for transferring the target object, preset prior to the appointment, into a transfer schedule arranged to avoid use of a processing unit designated as the process instrument replacement target; confirming that a process on the target object is finished in the processing unit designated as the process instrument replacement target, and providing information that a process instrument replacing operation is permitted to start; and, when a shutter of the processing unit designated as the process instrument replacement target is closed to perform a process instrument replacing operation and an operation prohibition state is thereby applied to the transfer means, canceling the operation prohibition state to allow the transfer means to perform a load/unload operation relative to a processing unit not designated as a process instrument replacement target.

According to the first and fourth aspects of the present invention, a operation prohibition state applied to the transfer means is cancelled, so as to allow the transfer means to perform a load/unload operation relative to a processing unit not designated as a process instrument replacement target, on the two conditions that a process on the target object is finished in a processing unit designated as the process instrument replacement target, and a shutter of the processing unit designated as the process instrument replacement target is closed. Consequently, it is possible to replace the process instrument more safely and rapidly, as compared to a case where the shutter is closed by an operator's switching operation.

According to the second and fifth aspects of the present invention, takeoff suspension of the next lot from the carry-in section is set before a process instrument replacing operation is started. Consequently, even where there is no alternative processing unit of the same type as the processing unit designated as the process instrument replacement target, it is possible to prevent a process from being unnecessarily performed in a processing unit other than the process instrument replacement target.

According to the third and sixth aspects of the present invention, where a process instrument is replaced at only one of a plurality of processing units of the same type, the transfer schedule is changed to continue a process by use of another processing unit, which is not designated as a process instrument replacement target, but of the same type as the processing unit designated as the process instrument replacement target. Consequently, it is possible to continue processes without extremely decreasing the operation rate of the entire processing apparatus.

DETAILED DESCRIPTION OF THE INVENTION

An embodiment of the present invention will now be described with reference to the accompanying drawings. In this embodiment, the present invention is applied to a method for replacing a process cup in a resist liquid coating/developing system for semiconductor wafers.

Figure 1:
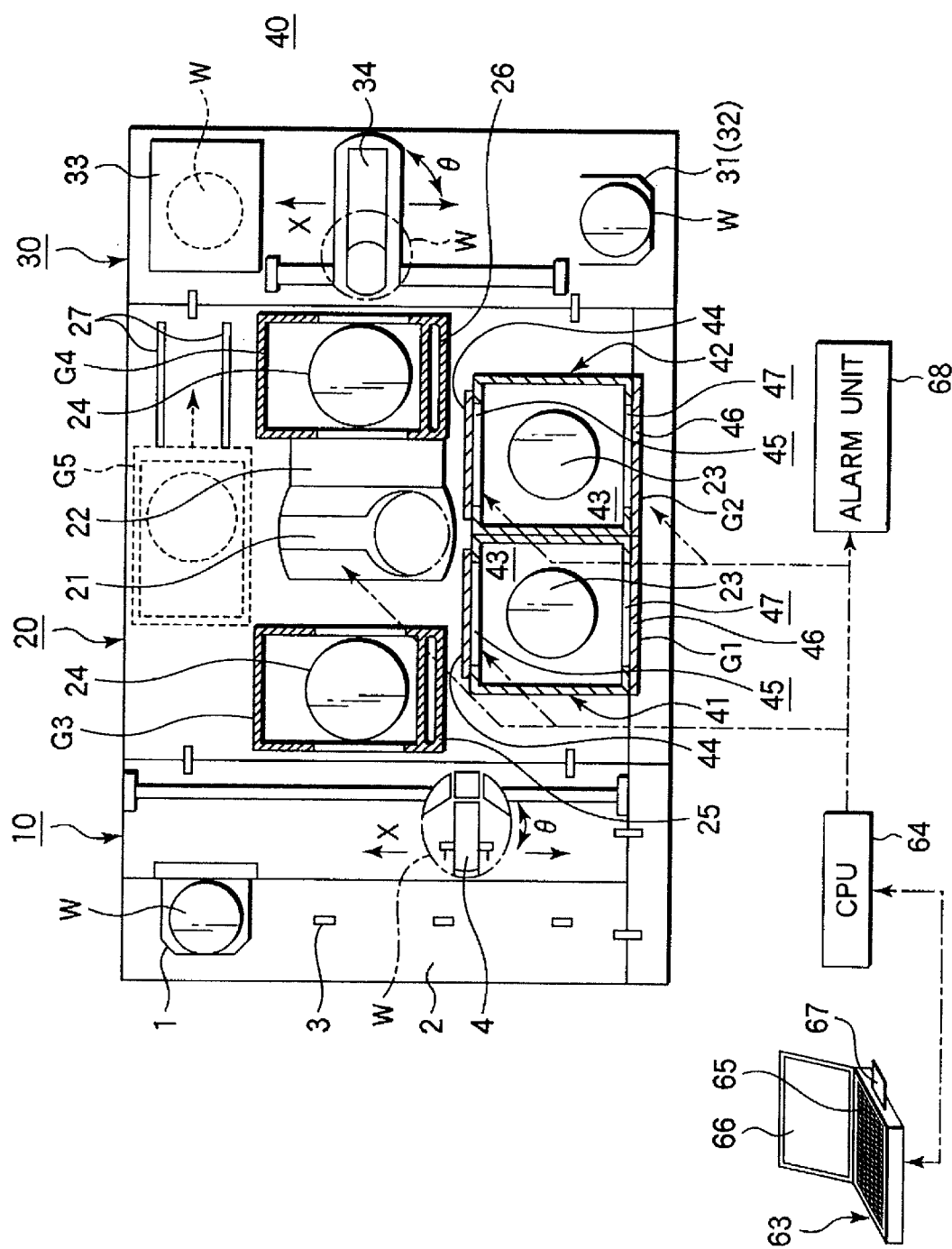
FIG. 1 is a plan view schematically showing an example of a resist liquid coating/developing system, to which a method for replacing a process cup according to the present invention can be applied.

FIG. 1 is a plan view schematically showing a resist liquid coating/developing system according to this embodiment.

Figure 2:
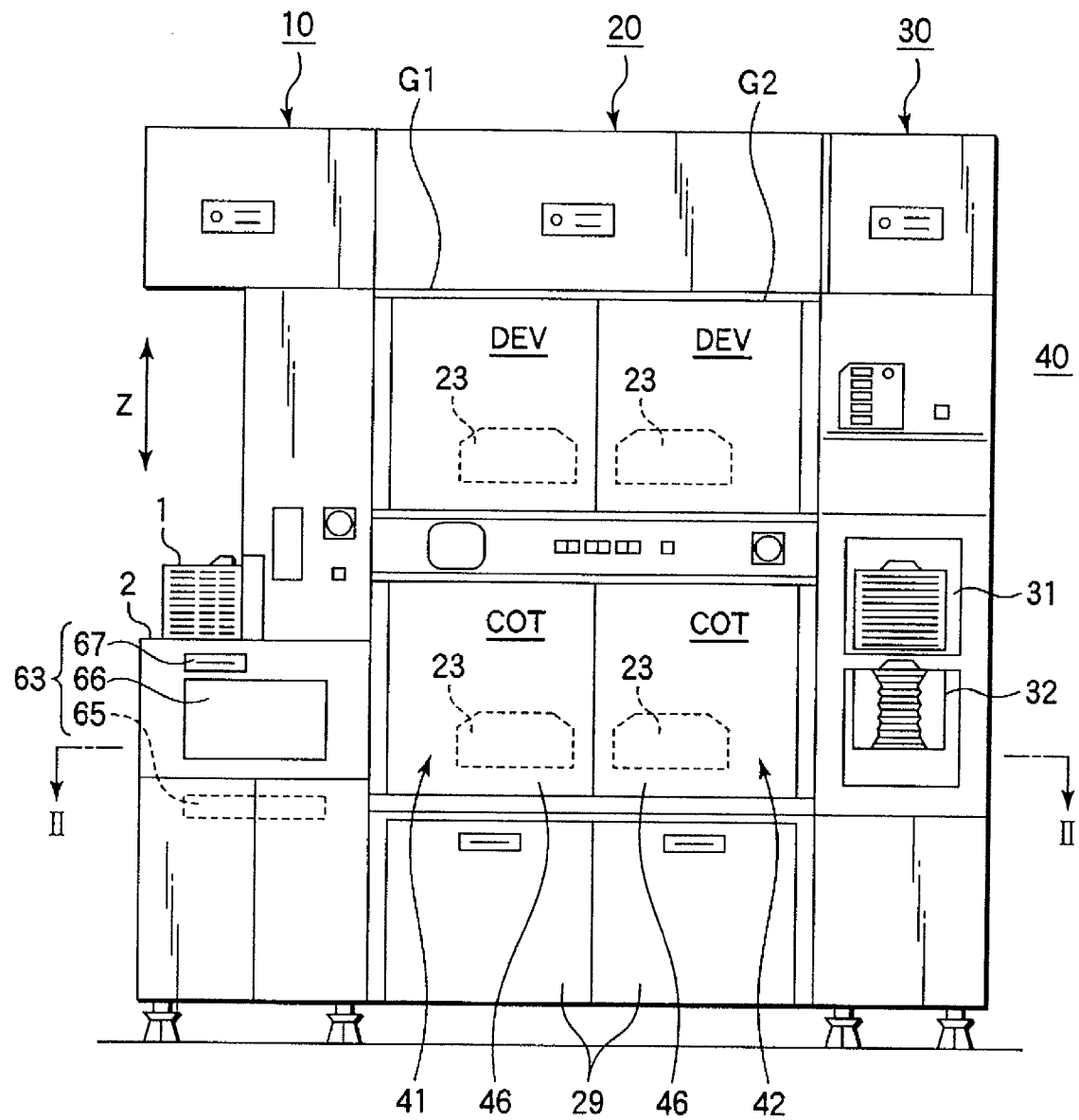
FIG. 2 is a front view schematically showing the resist liquid coating/developing system.
Figure 3:
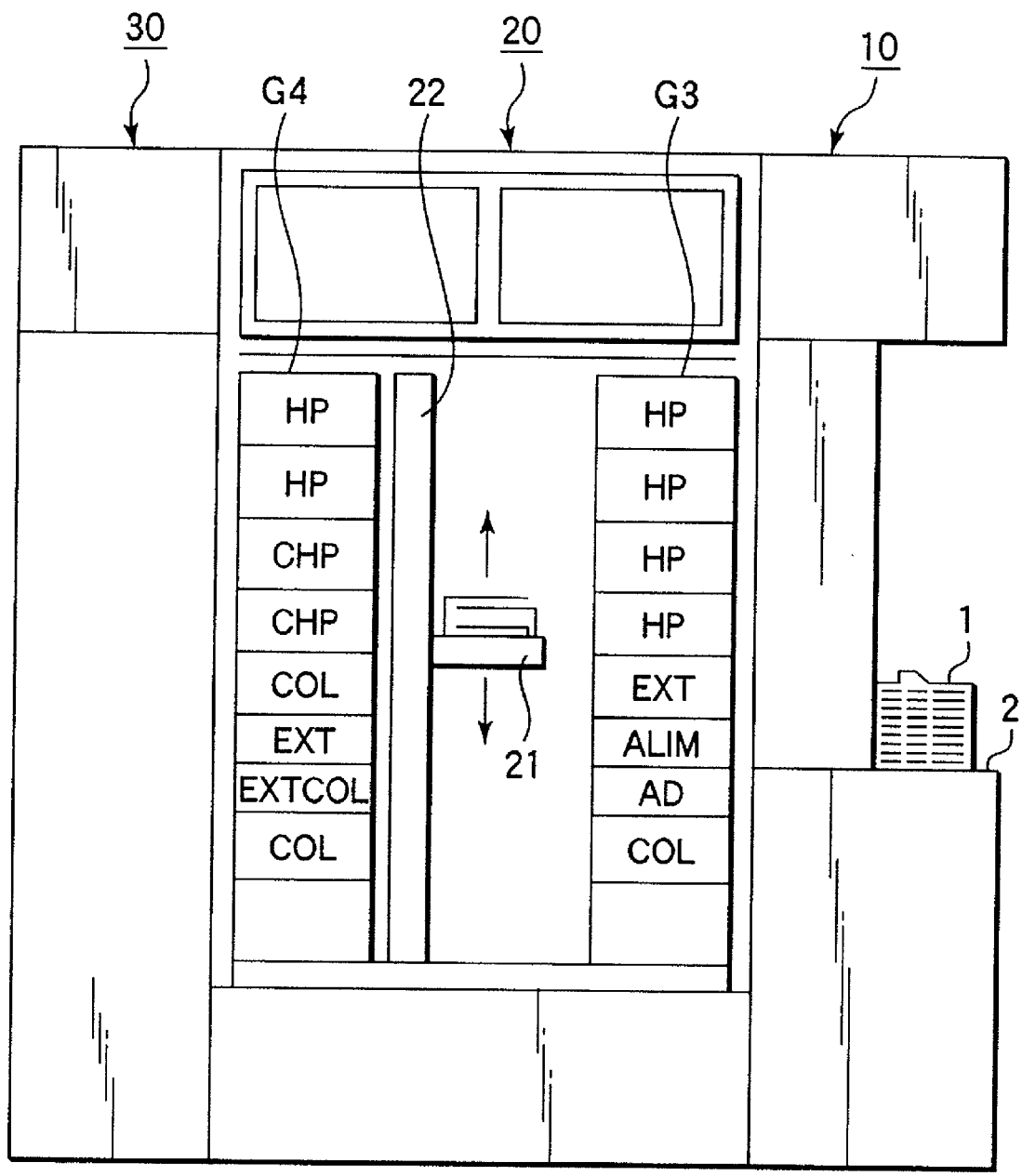
FIG. 3 is a back view schematically showing the resist liquid coating/developing system.

FIG. 2 is a front view of the system shown FIG. 1. FIG. 3 is a back view of the system shown FIG. 1.

The resist liquid coating/developing system comprises a cassette station 10, a process station 20, and an interface section 30, as the main sections. The cassette station 10 serves as a carry-in section and a carry-out section such that wafer cassettes 1 are transferred therethrough from the outside to this system and from this system to the outside. Each of the wafer cassettes 1 stores a plurality of, e.g., 25, target objects or semiconductor wafers W (which will be referred to as wafers W). Further, the cassette station 10 is used to transfer wafers W to and from the wafer cassettes 1. The process station 20 includes a processing apparatus main body formed of a plurality of processing units of various types stacked each other at predetermined positions. Each of the processing units is configured to perform a predetermined process on wafers W one by one during coating and developing processes. The interface section 30 is used to transfer wafers W between the process station 20 and a light exposure apparatus (not shown) located adjacent thereto.

As shown in FIG. 1, the cassette station 10 includes a cassette table 2 for placing wafer cassettes 1 thereon. The cassette station 10 is provided with a plurality of, e.g., four, projections 3, so that the wafer cassettes 1 are placed in a row in a horizontal X-direction at positions set by the projections 3 while their wafer port openings are directed toward the process station 20. The cassette station 10 includes a wafer transfer arm 4, which is movable in the cassette array direction (X-direction) and the array direction of wafers W (Z-direction) stored and stacked in each cassette 1 in the vertical direction. Accordingly, the wafer transfer arm 4 can selectively transfer wafers W to and from any one of the wafer cassettes 1. Further, the wafer transfer arm 4 is rotatable in a θ-direction, as shown in FIG. 1, so that it can also access an alignment unit (ALIM) and an extension unit (EXT) that belong to the stacked units of a third group G3 of the process station 20, as described later.

As shown in FIG. 1, the process station 20 has a main wafer transfer mechanism 21 of the vertical transfer type located at the center and used as transfer means. The main wafer transfer mechanism 21 is accommodated in a casing 22, around which all the processing units are stacked and divided into one or plurality of groups. In this embodiment, five groups G1, G2, G3, G4, and G5 each including stacked units are arranged. Of them, the stacked units of the first and second groups G1 and G2 are located side by side on the front side of the system. The stacked units of the third group G3 are located adjacent to the cassette station 10. The stacked units of the fourth group G4 are located adjacent to the interface section 30. The stacked units of the fifth group G5 are located on the rear side.

As shown in FIG. 2, the first group G1 includes two processing units formed of a resist coating unit (COT) and a developing unit (DEV) stacked each other in the vertical direction in this order from below. The resist coating unit (COT) is arranged such that a predetermined process is performed on a wafer W held on a spin chuck (not shown). The developing unit (DEV) is arranged such that developing solution supply means (not shown) is placed opposite to a wafer W within a container or process cup 23 to perform development of a resist pattern. The second group G2 also includes two processing units formed of a resist coating unit (COT) and a developing unit (DEV) stacked each other in the vertical direction in this order from below. The resist coating unit (COT) is located on the lower side, because the draining structure for the resist liquid is complicated in terms of the mechanism and maintenance. However, the resist coating unit (COT) may be located on the upper side, as needed.

As shown in FIG. 3, the third group G3 includes processing units of the oven type stacked each other in the vertical direction, in each of which a predetermined process is performed on a wafer W placed on a wafer table 24 (see FIG. 1). For example, the third group G3 includes eight processing units formed of, in this order from below, a cooling unit (COL) for cooling a wafer W; an adhesion unit (AD) for performing a hydrophobization process on a wafer W; an alignment unit (ALIM) for performing alignment of a wafer W; an extension unit (EXT) for transferring wafers W; and four hot plate units (HP) for baking a wafer W. The fourth group G4 also includes processing units of the oven type stacked each other in the vertical direction. For example, the fourth group G4 includes eight processing units formed of, in this order from below, a cooling unit (COL); an extension and cooling unit (EXTCOL); an extension unit (EXT); a cooling unit (COL); two chilling hot plate units (CHP) having a rapid cooling function; and two hot plate units (HP).

As described above, the cooling unit (COL) and extension and cooling unit (EXTCOL), which use low process temperatures, are located on the lower side, while the hot plate unit (HP), chilling hot plate unit (CHP), and adhesion unit (AD), which use high process temperatures, are located on the upper side. Consequently, the thermal mutual interference between these units can be suppressed. However, these units may be stacked each other at random.

As shown in FIG. 1, in the process station 20, ducts 25 and 26 are respectively extended in the vertical direction in the sidewalls of the stacked units (processing units of the oven type) of the third and fourth groups G3 and G4, which are adjacent to the stacked units (processing units of the spinner type) of the first and second groups G1 and G2. Clean air or air at a temperature specially adjusted is supplied to flow through the ducts 25 and 26 as a downflow. This duct structure blocks off heat generated in the processing units of the oven type of the third and fourth groups G3 and G4, so that the heat does not affect the processing units of the spinner type of the first and second groups G1 and G2.

Further, in this processing system, the stacked units of the fifth group G5 may be located on the rear side of the main wafer transfer mechanism 21, as indicated by broken lines in FIG. 1. The fifth group G5 is arranged to be movable laterally relative to the main wafer transfer mechanism 21 along a guide rail 27. Accordingly, even where the stacked units of the fifth group G5 are set up, a space is formed by sliding these units along the guide rail 27, so that a maintenance operation can be easily performed on the main wafer transfer mechanism 21 from behind.

The interface section 30 has the same dimension as that of the process station 20 in the depth direction, but has a smaller dimension in the width direction. The interface section 30 includes a buffer cassette 32 of the stationary type and a pickup cassette 31 of the portable type stacked each other at two levels on the front side. The interface section 30 further includes a periphery light exposure unit 33 located on the rear side, which is light exposure means for performing light exposure on the peripheral portion of a wafer W and light exposure on the identification mark area thereof. The interface section 30 further includes a wafer transfer arm 34 located at the center and used as transfer means. The transfer arm 34 is movable in the X- and Z-directions, so that it can transfer wafers to the two cassettes 31 and 32 and periphery light exposure unit 33. Further, the wafer transfer arm 34 is rotatable in a θ-direction, so that it can also transfer wafers to the extension unit (EXT) in the stacked units of the fourth group G4 of the process station 20 and to a wafer transfer table (not shown) of the light exposure apparatus adjacent thereto.

The processing system arranged as described above is installed in a clean room 40. Further, the cleanliness of the respective portions inside the system is increased by an efficient laminar flow method.

Next, an explanation will be given of an operation of the resist liquid coating/developing system described above.

At first, in the cassette station 10, wafer transfer arm 4 accesses a cassette 1 that stores unprocessed wafers W on the cassette table 2, and takes out a wafer W from the cassette 1. The wafer W thus taken out is transferred by the wafer transfer arm 4 to the alignment unit (ALIM) in the stacked units of the third group G3 of the process station 20, and is placed on the wafer table 24 inside the unit (ALIM). The wafer W placed on the wafer table 24 is then subjected to orientation-flat alignment and centering operations. Thereafter, the main wafer transfer mechanism 21 accesses the alignment unit (ALIM) from the opposite side, and receives the wafer W from the wafer table 24.

In the process station 20, the wafer W is first transferred by the main wafer transfer mechanism 21 to the adhesion unit (AD) in the stacked units of the third group G3. In the adhesion unit (AD), the wafer W is subjected to a hydrophobization process. After the hydrophobization process is finished, the wafer W is transferred by the main wafer transfer mechanism 21 from the adhesion unit (AD) to the cooling unit (COL) in the stacked units of the third group G3 or fourth group and G4. In this cooling unit (COL), the wafer W is cooled to, e.g., 23° C., which is a set temperature prior to a resist coating process. After the cooling process is finished, the wafer W is transferred by the main wafer transfer mechanism 21 from the cooling unit (COL) to the resist coating unit (COT) in the stacked units of the first group G1 or second group G2. In this resist coating unit (COT), a resist is applied by a spin coating method onto the wafer W to form a film with a uniform thickness.

After the resist coating process is finished, the wafer W is transferred by the main wafer transfer mechanism 21 from the resist coating unit (COT) to one of the hot plate units (HP). In this hot plate unit (HP), the wafer W is placed on a table and is subjected to a pre-baking process at a predetermined temperature of, e.g., 100° C. for a predetermined time. With this process, remaining solvent in the coating film on the wafer W is removed by evaporation. After the pre-baking is finished, the wafer W is transferred by the main wafer transfer mechanism 21 from the hot plate unit (HP) to the extension and cooling unit (EXTCOL) in the stacked units of the fourth group G4. In this unit (EXTCOL), the wafer W is cooled to, e.g., 24° C., which is a temperature suitable for the next step, i.e., a periphery light exposure process performed in the periphery light exposure unit 33. After this cooling is finished, the wafer W is transferred by the main wafer transfer mechanism 21 to the extension unit (EXT) immediately above the extension and cooling unit (EXTCOL), and is placed on a table (not shown) inside this unit (EXT). After the wafer W is placed on the table inside this extension unit (EXT), the transfer arm 34 of the interface section 30 accesses this unit from the opposite side and receives the wafer W. Then, the wafer W is transferred by the transfer arm 34 to the periphery light exposure unit 33 in the interface section 30.

After the full face light exposure in the light exposure apparatus is fished and the wafer W is returned to the wafer transfer table on the light exposure apparatus side, the transfer arm 34 of the interface section 30 accesses this wafer transfer table and receives the wafer W. Then, the wafer W is transferred by the transfer arm 34 to the extension unit (EXT) in the stacked units of the fourth group G4 of the process station 20, and is placed on a wafer transfer table inside this unit (EXT).

Also, in this case, the wafer W may be temporarily placed in the buffer cassette 32 of the interface section 30 before it is delivered to the process station 20 side.

Then, the wafer W is transferred by the main wafer transfer mechanism 21 from the wafer transfer table inside the extension unit (EXT) to the chilling hot plate unit (CHP). In the chilling hot plate unit (CHP), the wafer is subjected to a post exposure baking process for preventing fringe generation or for inducing an acid catalyst reaction for a chemical amplification type resist (CAR).

Thereafter, the wafer W is transferred to the developing unit (DEV) in the stacked units of the first group G1 or second group G2. In this developing unit (DEV), a developing process is performed while a developing solution is supplied all over the resist on the surface of the wafer W. With this developing process, the resist film formed on the surface of the wafer W is developed to have a predetermined circuit pattern. In addition, an unnecessary part of the resist film is removed from the peripheral portion of the wafer W. Further, a part of the resist film is removed from the area of an alignment mark M formed (applied) on the surface of the wafer W. After the developing process is finished, a rinsing liquid is supplied onto the surface of the wafer W to wash out the developing solution.

After this development step is finished, the wafer W is transferred by the main wafer transfer mechanism 21 from the developing unit (DEV) to one of the hot plate units (HP) in the stacked units of the third group G3 or fourth group G4. In this unit (HP), the wafer W is subjected to a post baking process at a temperature of, e.g., 100° C. for a predetermined time. With this process, the resist swelled by the development is cured and is thereby improved in the chemical resistance.

After the post baking is finished, the wafer W is transferred by the main wafer transfer mechanism 21 from the hot plate unit (HP) to one of the cooling units (COL). In this cooling units (COL), the wafer W is cooled to room temperature. Then, the wafer W is transferred by the main wafer transfer mechanism 21 from the cooling units (COL) to the extension unit (EXT) in the third group G3. After the wafer W is placed on a table (not shown) inside this extension unit (EXT), the wafer transfer arm 4 of the cassette station 10 accesses this unit from the opposite side and receives the wafer W. Then, the wafer W is transferred by the wafer transfer arm 4 and is inserted into a predetermined wafer receiving groove in a cassette 1 for storing processed wafers on the cassette table 2. As a result, the process is completed.

Next, an explanation will be give of the structure of the resist coating unit shown in FIG. 1. The resist coating/developing system includes two resist coating units of the same type. Specifically, they are a first processing unit 41 (first coating unit 41) of the spinner type belonging to the first group G1 and a second processing unit 42 (second coating unit 42) of the spinner type belonging to the second group G2. Each of first and second coating units 41 and 42 includes a process chamber 43, which has a transfer port 45 formed adjacent to the main wafer transfer mechanism 21 and provided with a shutter 44 for opening/closing the port 45. The process chamber 43 further has a maintenance opening 47 formed on the outer side (the lower side in FIG. 1) and provided with a cover door 46 for opening/closing the opening 47.

Figure 4:
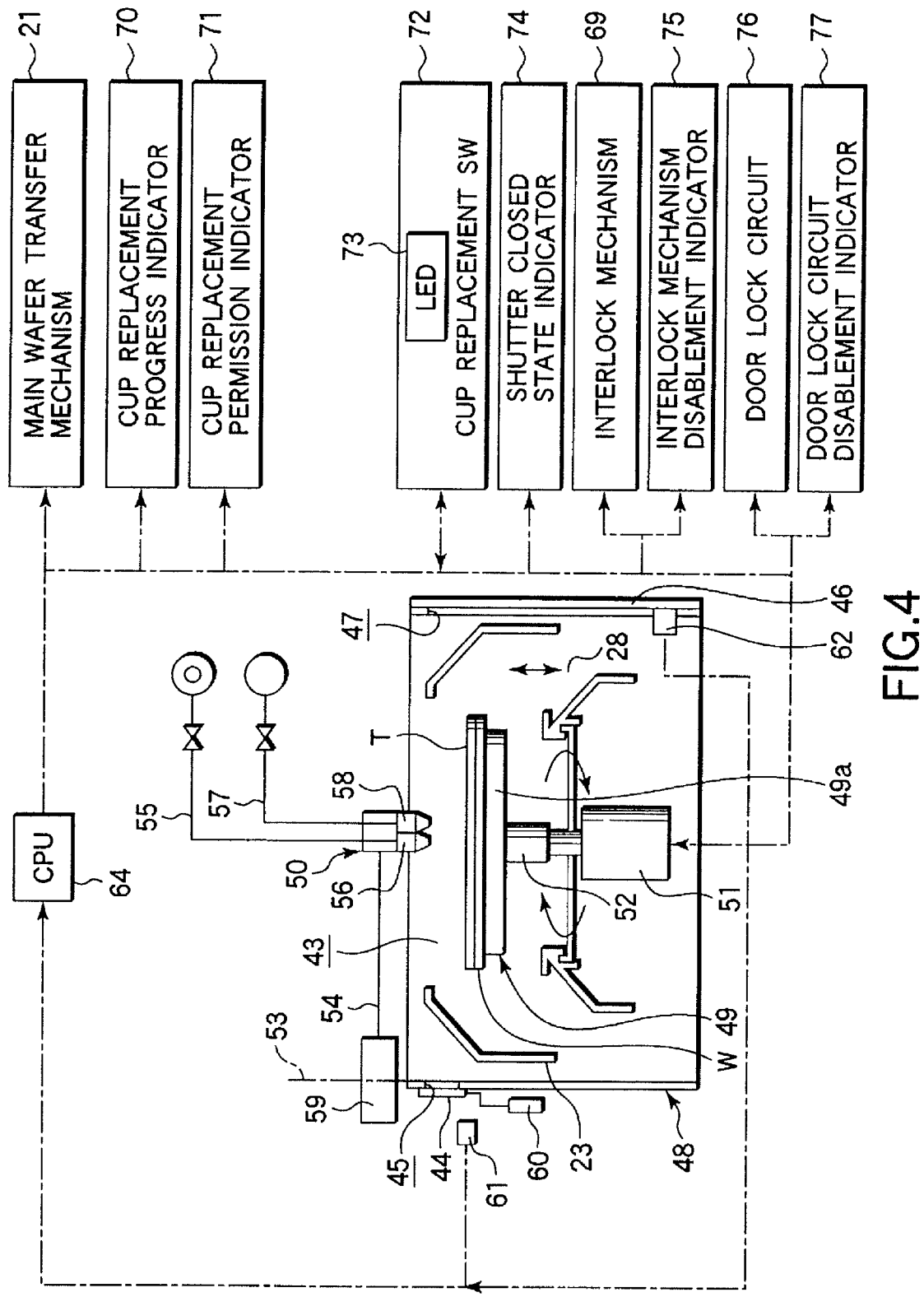
FIG. 4 is a view showing the structure of a coating unit used in the resist liquid coating/developing system.

FIG. 4 shows a specific structure of the first and second coating units 41 and 42. Each of first and second coating units 41 and 42 includes a casing 48, in which a spin chuck 49, a process cup 23, and a complex nozzle 50 are arranged. The spin chuck 49 serves as holding means for holding a wafer W to be rotatable. The process cup 23 surrounds the spin chuck 49, wafer W, and portions therebelow. The complex nozzle 50 can supply process liquids or coating liquids, such as a resist liquid and a solvent, onto the surface of the wafer W.

The spin chuck 49 includes a chuck plate 49a attached at the top of a rotary shaft 52 to be rotated by a spin motor 51 located on the lower side in the casing 48. The chuck plate 49a is provided with a holding member (not shown) vertically extending from the peripheral edge. The holding member is configured to hold the peripheral edge of the wafer W such that the wafer W is separated above from the chuck plate 49a.

The atmosphere inside the process cup 23 is exhausted through the bottom of the process cup 23 by exhaust means, such as a vacuum pump, located outside. Further, part of a process liquid scattered by rotation of the wafer W is exhausted from around the spin chuck 49 into the drain 28 located at the bottom of the process cup 23. The process cup 23 is movable up and down, and is detachable for maintenance, as needed.

The complex nozzle 50 is attached to the top of the swing arm 54 serving as a traveling member that swings about a pivot shaft 53. The complex nozzle 50 includes a coating liquid supply nozzle 56 connected to a coating liquid supply conduit 55 and configured to deliver a coating liquid, and a solvent supply nozzle 58 connected to a solvent supply conduit 57 and configured to deliver a solvent. These nozzles 56 and 58 are located above the wafer W side by side in radial direction of the wafer W, and are opened on the lower face of the complex nozzle 50. Specifically, the coating liquid supply nozzle 56 and solvent supply nozzle 58 arrayed side by side with a predetermined gap therebetween such that the coating liquid supply nozzle 56 is positioned on the inner side and the solvent supply nozzle 58 is positioned on the outer side in radial direction of the wafer W. A coating liquid is supplied from the coating liquid supply conduit 55 to the coating liquid supply nozzle 56. A solvent is supplied from the solvent supply conduit 57 to the solvent supply nozzle 58. The coating liquid and solvent are then delivered independently of each other from these nozzles 56 and 58.

As shown in FIG. 4, the swing arm 54 is fixed in a horizontal state at the top of the pivot shaft 53, which vertically extends outside the process cup 23. The swing arm 54 is swung in a horizontal plane by a rotary mechanism 59 (nozzle shifting mechanism 59) connected to the pivot shaft 53. The swing arm 54 can be moved above the wafer W between a position near the center of the wafer W and a waiting position (home position) outside the process cup 23. During a process for forming a coating film T on the wafer W, the swing arm 54 is moved between these positions.

Next, an explanation will be given of a control system used for replacing the process cup.

The shutter 44 on the transfer port 45 of the process chamber 43 is arranged to be moved up and down by an opening/closing driving mechanism 60, such as a cylinder, to open/close the transfer port 45. In order to detect the shutter 44 being opened/closed, a shutter opening/closing sensor 61 of, e.g., the optical type is located near the shutter 44 to output a detection signal when the shutter 44 is opened. Further, in order to detect door-interlocking for the cover door 46, a door switch 62 is located at the edge of the maintenance opening 47.

The shutter opening/closing sensor 61 and door switch 62 are connected to an input of a control computer 63 serving as control means. The processing apparatus described above is preset to be controlled by process sequences stored in this control computer 63 in advance.

As schematically shown in FIG. 1, the control computer 63 includes control means 64 formed of a central processing unit (CPU) serving as a main body (the control means 64 will be referred to as a CPU 64). The control computer 63 further includes an I/O (input/output) section 65 connected to the CPU 64, a display section 66 arranged to display the image pictures concerning an input process sequence to fabricate the process sequence, and a storage medium 67, which stores a control software, attached to the I/O section 65. As shown in FIG. 2, the control computer 63 is placed on the cassette table 2 of the cassette station 10. In this embodiment, the control computer 63 comprises the I/O section 65 formed of a retractable keyboard of the pullout type, the display section 66, and the storage medium 67.

The storage medium 67 may be a medium stationary in the control computer 63, or a medium detachably attached to and read by a reading device provided in the control computer 63. In the most typical case, the storage medium 67 is formed of a hard disk drive with control software installed therein by a service man of the maker of this substrate processing apparatus. In another case, the storage medium 67 is formed of a reading only removable disk, such as a CD-ROM or DVD-ROM, with a control software stored therein. A removable disk of this kind is read by an optical reading device provided in the control computer 63. The storage medium 67 may be any one of the RAM (random access memory) and ROM (read only memory) types. Further, the storage medium 67 may be a ROM of the cassette type. In other words, the storage medium 67 can be formed of an any one of the storage media known in the technical filed of computers.

The control computer 63 arranged as described above executes a control software to perform control for realizing the following functions. Specifically, one of the functions is an interlock mechanism (door lock circuit) to essentially stop the processing apparatus when the cover door 46 is opened. Another function is an interlock mechanism to prohibit an operation of the transfer means or transfer arm 34 when the shutter 44 is closed. Another function is a special control function, for example, to stop the spin motor when the cup is replaced. Further, the control computer 63 performs ordinary control for realizing various process conditions defined by a predetermined process sequence for the respective functional components of the processing system, such as operations of the main wafer transfer mechanism 21 and spin chuck 49, and supply and stop of the coating liquid and solvent from the nozzles 56 and 58.

Figure 5:
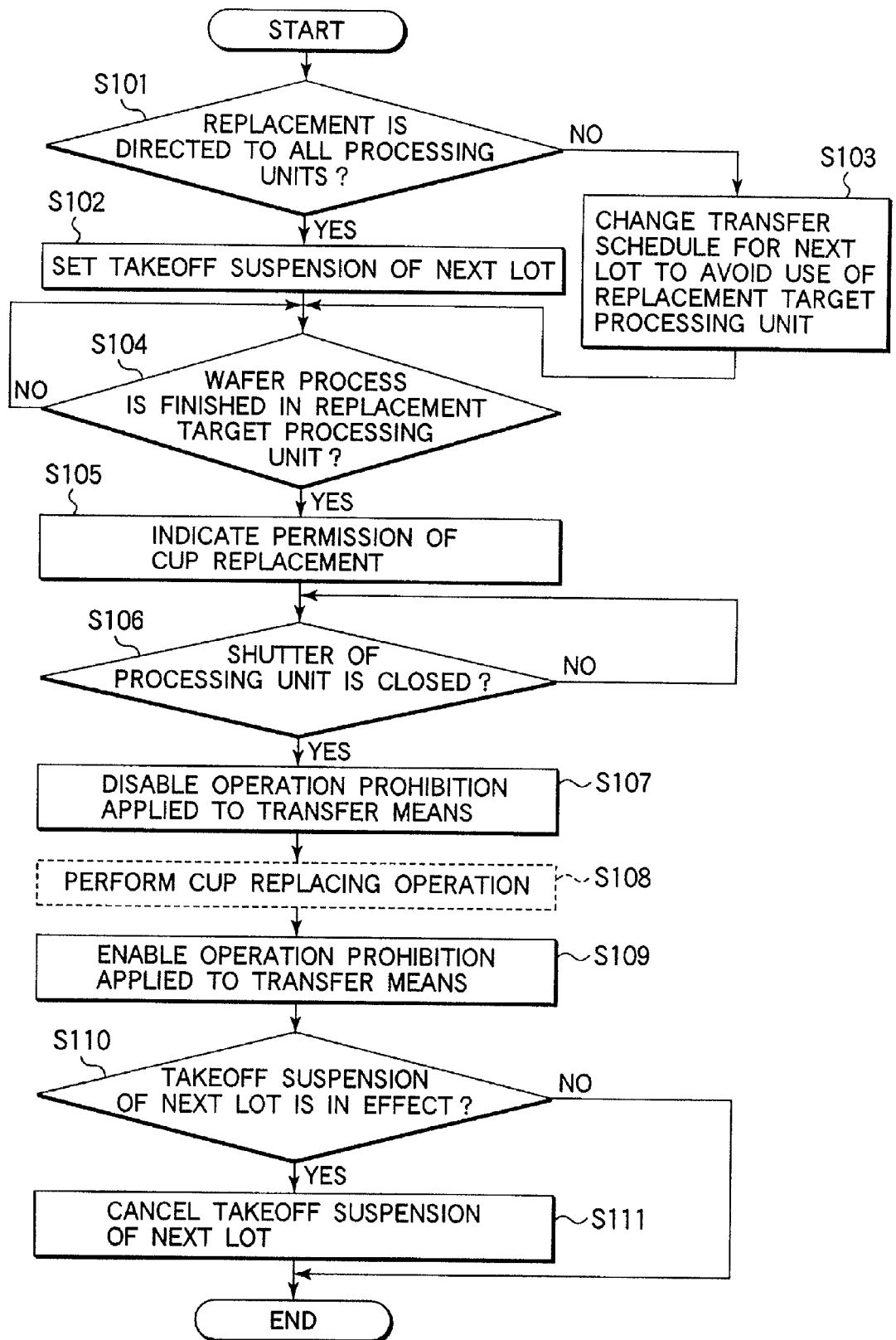
FIG. 5 is a flowchart showing a method for replacing a process cup according to the present invention.

In this embodiment, a program for replacing the process cup 23 in accordance with the flow shown in FIG. 5 is stored in advance in the storage medium 67 of the control computer 63. The control computer 63 controls the transfer arm 34 to transfer wafers W based on this process program.

Next, an explanation will be given of a method for replacing the process cup 23 with reference to FIG. 5.

(1) A case where all the coating units are designated as cup replacement target processing units.

This cup replacement process will be explained in a case where a processing apparatus includes one or a plurality of processing units of the same type (for example, a coating unit), and in consideration further of a process performed in another processing unit (for example, a developing unit).

Where the process cups 23 of all the coating units of the same type are replaced, the processing apparatus cannot keep performing a sequential process. In light of this, appointment registrations (preset) for the replacement target processing units are made in advance in the CPU 64. Accordingly, in the flow shown in FIG. 5, it is first judged whether the process cup replacement is directed to all the processing units (or unit), with reference to the type and number of the processing units instructed by an operator or known by stored data (Step S101).

Where this process cup replacement is directed to all the processing units (or unit) (Yes at Step S101), e.g., it is directed to the processing units of the same type, such as the coating units 41 and 42, an instruction to set takeoff suspension of the next lot is sent to the cassette station 10 serving as a carry-in section (Step S102).

Then, it is checked whether the process on the last wafer W is finished in the cup replacement target processing units (the first and second coating units 41 and 42) (Step S104). Where a wafer W in process remains (No at Step S104), the flow waits until the process on the last wafer W is finished (Step S104).

When the process on the last wafer W is finished in the replacement target processing units (the finish timing may be not single where processes are performed in the processing units in parallel), the CPU 64 informs an operator that a replacing operation of the process cups 23 is permitted (Step S105). Then, the flow waits until the shutter 44 on the transfer port 45 of each of the processing units is closed by an operator (Step S106).

When the shutter 44 is closed, the interlock mechanism 69 is thereby activated in general. In light of this, operation prohibition applied to the transfer means by the interlock mechanism 69 is set disabled (Step S107). Consequently, the main wafer transfer mechanism 21 is allowed to perform a load/unload operation relative to a processing unit not designated as a process instrument replacement target.

After this state is established, the cover door 46 is opened and a cup replacing operation is performed by an operator (Step S108). At this time, a shutter lock (not shown) is operated by the operator to prevent the shutter 44 from being mechanically opened.

After the cup replacing operation is finished, the operation prohibition applied to the main wafer transfer mechanism 21 by the interlock mechanism 69 is re-set enabled (Step S109). Then, an instruction to cancel the takeoff suspension of the next lot is sent to the cassette station 10 serving as a carry-in section (Steps S109 to S110), thereby completing the flow.

According to this method for replacing the process cups 23, it is possible to prevent takeoff of the next lot from the carry-in section.

(2) A case where a cup replacement target processing unit is solely considered.

This is a case where the first coating unit 41 is designated as a cup replacement target processing unit, and control is performed without reference to the processes performed in the other processing units (for example, the second coating unit 42 and developing unit). In this case, the cup replacement process flow shown in FIG. 5 is modified to exclude Steps S101 to S103 and Steps S109 to S110.

In this case, an appointment registration (preset) for the cup replacement target processing unit (first coating unit 41) is made in advance in the CPU 64. Then, it is checked by the CPU 64 whether a wafer in process is present in the cup replacement target processing unit (first coating unit 41), i.e., the process on the target object is finished (Step S104). Where a wafer W in process remains (No at Step S104), the flow waits until the process on the last wafer W is finished (Step S104).

When the process on the last wafer W is finished, and the wafer W is unloaded from the processing unit (first coating unit 41), the CPU 64 informs an operator by use of an alarm unit 68 (see FIG. 1) that a cup replacing operation of the process cup 23 is permitted (Step S105). Then, it is confirmed whether the shutter 44 on the transfer port 45 of the processing unit (first coating unit 41) is closed by an operator (Step S106). The shutter 44 being closed is detected by the CPU 64 that observes the output of the shutter opening/closing sensor 61. After the shutter 44 is closed, the cover door 46 is opened to perform maintenance of the process cup 23.

When the cover door 46 is opened, the interlock mechanism 69 (see FIG. 5) is thereby activated in general, and an operation prohibition state is applied to the transfer means or main wafer transfer mechanism 21. In light of this, operation prohibition applied to the main wafer transfer mechanism 21 by the interlock mechanism 69 is set disabled (Step S107). Consequently, the main wafer transfer mechanism 21 is allowed to perform a load/unload operation relative to a processing unit not designated as a process instrument replacement target.

After this state is established, a cup replacing operation is performed by an operator through the maintenance opening 47 with the cover door 46 opened (Step S108). At this time, a shutter lock (not shown) is operated by the operator to prevent the shutter 44 from being mechanically opened. The cover door 46 being opened is detected by the CPU 64 that observes the output of the door switch 62.

After the cup replacing operation is finished, the operation prohibition applied to the main wafer transfer mechanism 21 by the interlock mechanism 69 is re-set enabled (Step S109), thereby completing the flow.

According to this method for replacing the process cups 23, where a wafer W in process is present in the cup replacement target processing unit, the end of the process is used as a time point to provide information that process cup replacement is permitted. Accordingly, it is possible for an operator to immediately close the shutter 44 and open the cover door 46 to start an cup replacing operation.

(3) A case where one of a plurality of processing units is designated as a cup replacement target.

This is a case where a processing apparatus includes a plurality of processing units of the same type (coating units), and one of them is designated as a process cup replacement target. In this case, a present coating process can be continued by use of another processing unit of the same type as the cup replace target processing unit.

At first, in the flow shown in FIG. 5, it is first judged whether the process cup replacement is directed to all the processing units, with reference to the type and number of the processing units instructed by an operator or known by stored data (Step S101). Where this process cup replacement is directed to not all the processing units (No at Step S101), e.g., it is directed to one of the processing units of the same type (coating units), (in this embodiment, two units formed of the first coating unit 41 and second coating unit 42), a change is made in the transfer schedule registered for the normal operation including no cup replacement appointment. Specifically, the transfer schedule for the next lot is changed by the CPU 64, based on a cup replacement appointment registration (preset), to avoid use of the cup replacement target processing unit (Step S103).

Then, it is checked whether the process on the target object is finished in the cup replacement target processing unit (the first coating unit 41) (Step S104). Where a wafer W in process remains (No at Step S104), the flow waits until the process on the last wafer W is finished (Step S104).

When the process on the last wafer W is finished, an operator is informed that a replacing operation of the process cup 23 is permitted (Step S105). Then, the flow waits until the shutter 44 on the transfer port 45 of the processing unit is closed by an operator (Step S106).

When the shutter 44 is closed, the interlock mechanism 69 is thereby activated in general. In light of this, operation prohibition applied to the main wafer transfer mechanism 21 by the interlock mechanism 69 is set disabled (Step S107). Consequently, the main wafer transfer mechanism 21 is allowed to perform a load/unload operation relative to a processing unit not designated as a process instrument replacement target.

After this state is established, the cover door 46 is opened and a cup replacing operation is performed by an operator (Step S108). At this time, a shutter lock (not shown) is operated by the operator to prevent the shutter 44 from being mechanically opened.

After the cup replacing operation is finished, the operation prohibition applied to the main wafer transfer mechanism 21 by the interlock mechanism 69 is re-set enabled (Step S109), thereby completing the flow.

According to this method for replacing the process cup 23, although the throughput of the coating process is decreased, it is possible to continue a present process on target objects, such as a developing process including a coating process, and a heating process, only with a change in the transfer schedule.

Specific Example

Next, a detailed explanation will be given of a specific example of a method for replacing a process cup 23 according to the present invention, with reference to FIGS. 4 and 6 to 8.

At first, a cup replacement appointment is made for a processing unit with a process cup 23 to be replaced (in this case, one of the first coating unit 41 and second coating unit 42) designated by an operator through the I/O section 65 of the control computer 63 with reference to the view of operational image pictures shown on the display section 66. At this time, changes are made in terms of the takeoff suspension of the next lot and the transfer schedule for the next lot.

Figure 6:
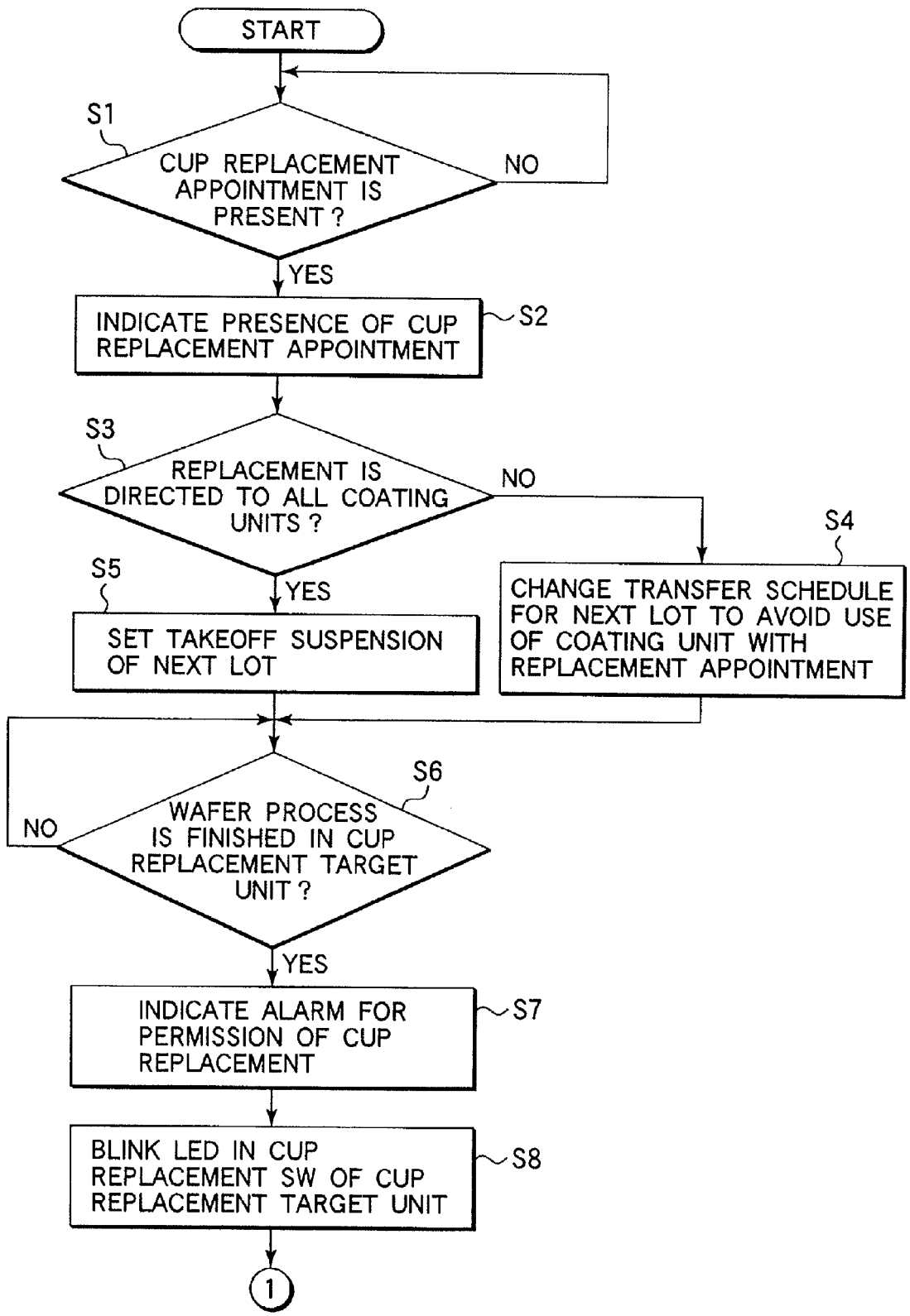
FIGS. 6 to 8 are views constituting a flowchart showing a specific example of a method for replacing a process cup according to the present invention.

As shown in FIG. 6, it is checked by the CPU 64 whether a cup replacement appointment is present (Step S1). Where a cup replacement appointment is present (Yes at Step S1), an alarm for "presence of cup replacement appointment" is indicated by cup replacement progress indicator 70 (see FIG. 4) of the alarm unit 68 or the display section 66 (see FIGS. 2 and 4) (Step S2).

Then, it is judged whether the process cup replacement is directed to all the coating units (or unit), with reference to the content of the cup replacement appointment (Step S3).

Where the process cup replacement is directed to not all the processing units (No at Step S3), e.g., it is directed to one of the processing units of the same type (coating units), (in this embodiment, two units formed of the first coating unit 41 and second coating unit 42), the transfer schedule for the next lot is changed to avoid use of the cup replacement target processing unit (Step S4).

On the other hand, where the process cup replacement is directed to all the processing units (or unit) (Yes at Step S3), e.g., it is directed to the sole processing unit (first coating unit 41) of the type designated as a replacement target processing unit, an instruction to set takeoff suspension of the next lot is sent to the cassette station 10 serving as a carry-in section (Step S5).

Then, it is checked whether the process on a wafer W is finished in the cup replacement target, i.e., first coating unit 41, (Step S64). Where a wafer W in process remains (No at Step S6), the flow waits until the process on the last wafer is finished and the wafer is unloaded from the first coating unit 41 (Step S6).

When the process on the last wafer W is finished, a cup replacement permission indicator 71 of the alarm unit 68 (see FIG. 4) is activated by the CPU 64 to show an alarm to provide an operator with information that a replacing operation of the process cups 23 is permitted (Step S7). Then, an LED 73 built in a cup replacement switch 72 (see FIG. 4) of the cup replacement target, i.e., first coating unit 41, is blinked (Step S8). An operator can push the cup replacement switch 72 in response to the LED 73 being blinked.

Figure 7:
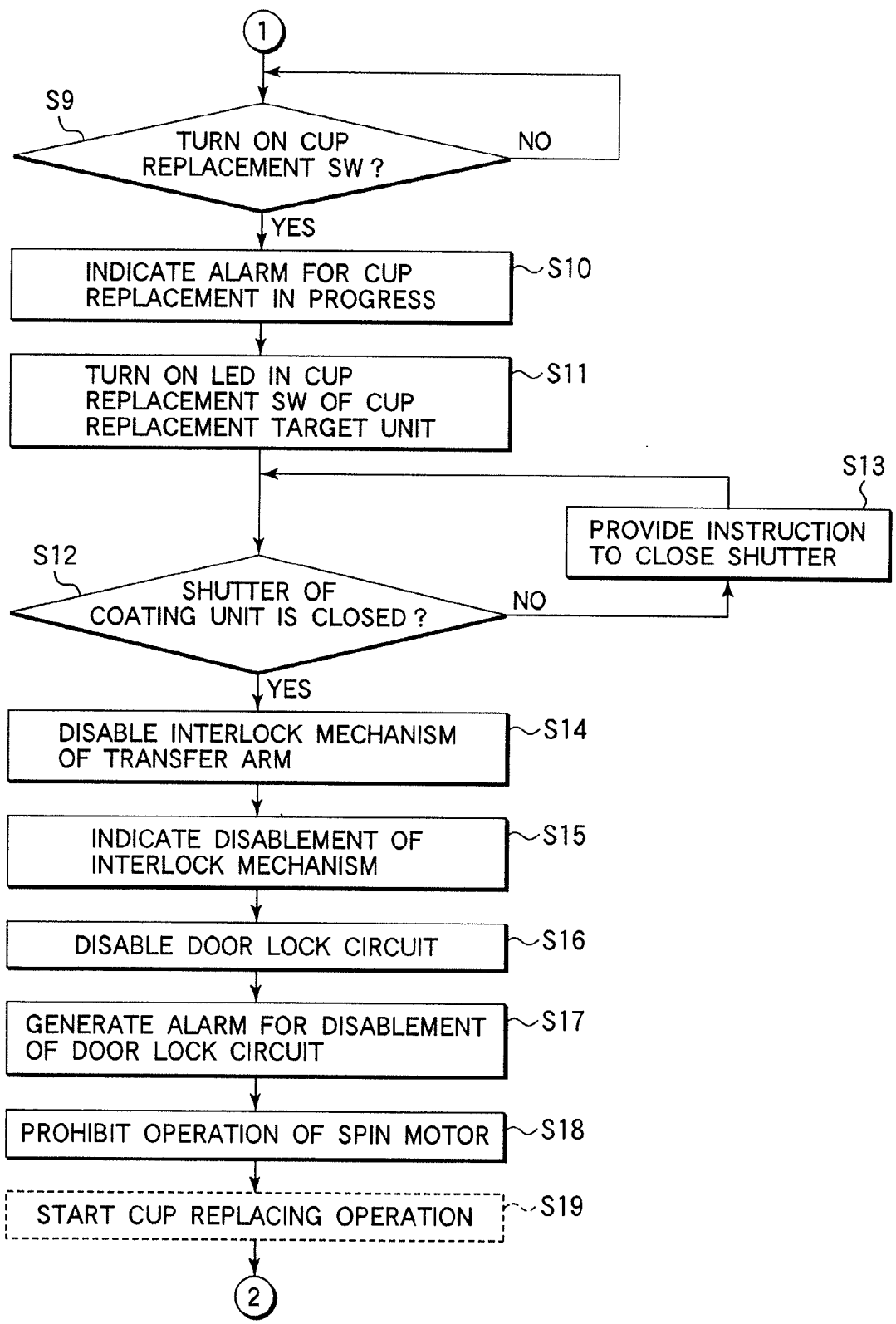

Then, as shown in FIG. 7, it is checked by the CPU 64 whether the cup replacement switch 72 has been turned on (Step S9). Where the cup replacement switch 72 is in the ON-state (Yes at Step S9), the cup replacement progress indicator 70 of the alarm unit 68 is activated to shown an alarm for cup replacement in progress (Step S10), and the LED 73 built in the cup replacement switch 72 is turned on (Step S11).

Then, it is confirmed whether the shutter 44 is closed (Step 12). Where the shutter 44 is not closed (No at Step 12), an instruction to close the shutter 44 is provided (Step 13).

Where the shutter 44 is closed (Yes at Step S12), the interlock mechanism 69 (see FIG. 5) is thereby activated in general. In light of this, the interlock mechanism 69 is set disabled, so that an operation prohibition state applied to the main wafer transfer mechanism 21 is cancelled (Step S14). Further, an interlock mechanism disablement indicator 75 (see FIG. 5) is activated to provide information about this disablement (Step S15). Consequently, the main wafer transfer mechanism 21 is allowed to perform a load/unload operation relative to a processing unit not designated as a process instrument replacement target.

Then, a door lock circuit 76 (see FIG. 4) serving as an interlock mechanism for the cover door 46 is set disabled (Step S16). Further, a door lock circuit disablement indicator 77 (see FIG. 4) is activated to generate an alarm for this disablement of the door lock circuit (Step S17). Consequently, even where the cover door 46 is opened, the processing apparatus is not stopped, and thus it can continue an operation. Then, the operation of the spin motor 51 (see FIG. 4) is further prohibited for the safety (Step S18).

Thereafter, an objective replacing operation of the process cup 23 is started by an operator (Step S19). After this replacing operation is finished, the cup replacement switch 72 is pushed again by an operator to turn off the cup replacement switch 72.

Figure 8:
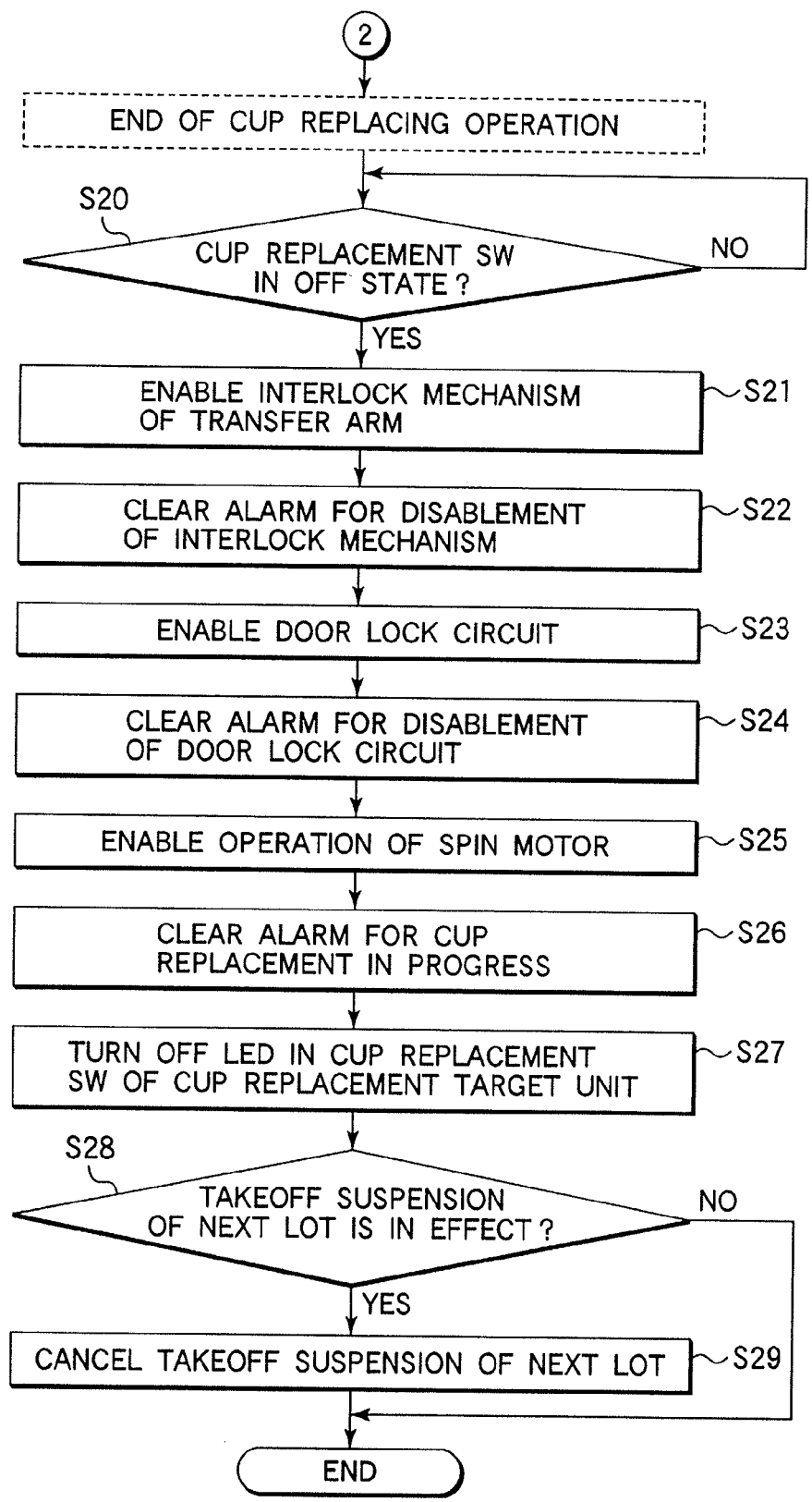

Then, as shown in FIG. 8, when the cup replacement switch 72 is turned off (Yes at Step S20), the interlock mechanism 69 is re-set enabled by the CPU 64 to work on the main wafer transfer mechanism 21 (Step S21). Further, the alarm for disablement of the interlock mechanism 69 is cleared (Step S22). In addition, the door lock circuit 76 is re-set enabled, and the alarm for disablement of the door lock circuit is cleared (Steps S23 and S24). The operation of the spin motor 51 is also re-set enabled (Step S25). Then, the alarm for cup replacement in progress is cleared (Step S26). Further, the LED 73 of the cup replacement switch 72 is turned off (Step S27).

As described above, where the first coating unit 41 is the sole unit, an instruction to set takeoff suspension of the next lot is used. In this case, at the end, an instruction to cancel the takeoff suspension of the next lot is sent to the cassette station 10 serving as a carry-in section (Steps S28 to S29).

According to the cup replacement process described above, (1) where replacement of a process cup 23 is directed to all the processing units (or unit) registered on the transfer schedule, (a) when a cup replacement appointment is made, takeoff suspension of the next lot is set, and (b) a process on the next lot is restarted after the cup replacement for all the processing units is finished. Further, (2) where replacement of a process cup 23 is directed to part of the processing units registered on the transfer schedule, (a) when a cup replacement appointment is made, the transfer schedule for the next lot and further subsequent lots is changed to avoid use of the cup replacement target processing unit, thereby continuing a lot process, and (b) when the cup replacement is finished, the transfer schedule for further subsequent unprocessed lots is changed to use all the modules, thereby continuing the process.

Incidentally, in the embodiment described above, a replacement target processing unit is exemplified by a coating unit having a process cup 23. However, the present invention is not limited to this embodiment, and it may be applied to a case where another process instrument used for a process, such as a nozzle 56 or 58, spin chuck 49, or filter, is replaced or inspected.

What is claimed is:

1. A method for performing process instrument replacement in a processing apparatus, in which target objects are loaded by a transfer mechanism into processing units and are processed therein, the method comprising:
   confirming that a process on the target object is finished in a designated one of the processing units designated to replace a process instrument attached therein, and providing information that a process instrument replacing operation is permitted to start; and,
   when the designated processing unit is set in a maintenance preparatory state to perform the process instrument replacing operation and an operation prohibition state is thereby applied to the transfer mechanism, canceling the operation prohibition state to allow the transfer mechanism to perform a load or unload operation of a target object relative to a processing unit not designated to replace a process instrument attached therein.

2. The method according to claim 1, wherein the operation prohibition state applied to the transfer mechanism is made by an interlock mechanism in response to a shutter of a target-object load port of the designated processing unit being closed.

3. The method according to claim 2, wherein the method further comprises enabling the operation prohibition state applied to the transfer mechanism by the interlock mechanism, in response to the process instrument replacing operation being finished.

4. The method according to claim 1, wherein the maintenance preparatory state includes a state where a maintenance door of the designated processing unit is open.

5. The method according to claim 1, wherein the designated processing unit is a resist coating unit and the process instrument is a cup surrounding a coating process field in the designated processing unit.

6. The method according to claim 1, wherein a plurality of the processing units are designated processing units designated to replace a process instrument attached therein, and said providing information that a process instrument replacing operation is permitted to start is performed after a last target object process is finished in the plurality of designated processing units.

7. The method according to claim 6, wherein the plurality of designated processing units are configured to perform the same process.

8. A method for performing process instrument replacement in a processing apparatus, in which target objects from a carry-in section are loaded by a transfer mechanism into processing units and are processed therein, and the target objects thus processed are unloaded by the transfer mechanism to a carry-out section, the method comprising:

setting a process instrument replacement appointment for a designated processing unit designated to replace a process instrument attached therein;

setting takeoff suspension of a next lot of target objects from the carry-in section to the designated processing unit, in response to the appointment being set, before starting a process instrument replacing operation;

confirming that a process on the target object is finished in the designated processing unit, and providing information that the process instrument replacing operation is permitted to start;

when the designated processing unit is set in a maintenance preparatory state to perform the process instrument replacing operation and an operation prohibition state is thereby applied to the transfer mechanism, canceling the operation prohibition state to allow the transfer mechanism to perform a load or unload operation of a target object relative to a processing unit not designated to replace a process instrument attached therein; and canceling the takeoff suspension of the next lot of target objects from the carry-in section to the designated processing unit, in response to the process instrument replacing operation being finished.

9. The method according to claim 8, wherein the operation prohibition state applied to the transfer mechanism is made by an interlock mechanism in response to a shutter of a target-object load port of the designated processing unit being closed.

10. The method according to claim 9, wherein the method further comprises enabling the operation prohibition state applied to the transfer mechanism by the interlock mechanism, in response to the process instrument replacing operation being finished.

11. The method according to claim 8, wherein the maintenance preparatory state includes a state where a maintenance door of the designated processing unit is open.

12. The method according to claim 8, wherein the designated processing unit is a resist coating unit and the process instrument is a cup surrounding a coating process field in the designated processing unit.

13. A method for performing process instrument replacement in a processing apparatus, in which target objects from a carry-in section are loaded by a transfer mechanism into processing units and are processed therein, and the target objects thus processed are unloaded by the transfer mechanism to a carry-out section, the processing units including predetermined processing units configured to perform the same process, the method comprising:

setting a process instrument replacement appointment for a designated processing unit designated to replace a process instrument attached therein among the predetermined processing units;

changing a transfer schedule for transferring the target objects, preset prior to the appointment, into a transfer schedule arranged to avoid use of the designated processing unit among the predetermined processing units;

confirming that a process on the target object is finished in the designated processing unit, and providing information that a process instrument replacing operation is permitted to start; and, when the designated processing unit is set in a maintenance preparatory state to perform the process instrument replacing operation and an operation prohibition state is thereby applied to the transfer mechanism, canceling the operation prohibition state to allow the transfer mechanism to perform a load or unload operation of a target object relative to a processing unit not designated to replace a process instrument attached therein.

14. The method according to claim 13, wherein a plurality of the processing units are designated processing units designated to replace a process instrument attached therein, and said providing information that a process instrument replacing operation is permitted to start is performed after a last target object process is finished in the plurality of designated processing units.

15. The method according to claim 13, wherein the operation prohibition state applied to the transfer mechanism is made by an interlock mechanism in response to a shutter of a target-object load port of the designated processing unit being closed.

16. The method according to claim 15, wherein the method further comprises enabling the operation prohibition state applied to the transfer mechanism by the interlock mechanism, in response to the process instrument replacing operation being finished.

17. The method according to claim 13, wherein the maintenance preparatory state includes a state where a maintenance door of the designated processing unit is open.

18. The method according to claim 13, wherein the method further comprises setting takeoff suspension of a next lot of target objects from the carry-in section to the designated processing unit, in response to the appointment being set, before staring the process instrument replacing operation, and canceling the takeoff suspension of the next lot of target objects from the carry-in section to the designated processing unit, in response to the process instrument replacing operation being finished.

19. The method according to claim 13, wherein the designated processing unit is a resist coating unit and the process instrument is a cup surrounding a coating process field in the designated processing unit.

* * * * *